(12) United States Patent
Pickard et al.

(10) Patent No.: US 7,279,023 B2
(45) Date of Patent: Oct. 9, 2007

(54) HIGH THERMAL CONDUCTIVITY METAL MATRIX COMPOSITES

(75) Inventors: Sion M. Pickard, Tucson, AZ (US); James C. Withers, Tucson, AZ (US); Raouf O. Loutfy, Tucson, AZ (US)

(73) Assignee: Materials and Electrochemical Research (MER) Corporation, Tucson, AZ (US)

( * ) Notice: Subject to any disclaimer, the term of this patent is extended or adjusted under 35 U.S.C. 154(b) by 309 days.

(21) Appl. No.: 10/677,454

(22) Filed: Oct. 2, 2003

(65) Prior Publication Data

US 2005/0074355 A1 Apr. 7, 2005

(51) Int. Cl.
*C22C 1/05* (2006.01)
*H01L 23/043* (2006.01)

(52) U.S. Cl. ............... 75/243; 75/245; 75/249; 428/539.5; 257/708; 257/720

(58) Field of Classification Search ............ 75/243, 75/249, 245; 428/545, 404, 408, 539.5; 361/709; 257/708; 527/720
See application file for complete search history.

(56) References Cited

U.S. PATENT DOCUMENTS

| | | | | | |
|---|---|---|---|---|---|
| 4,606,738 | A | * | 8/1986 | Hayden | ............... 51/295 |
| 4,643,741 | A | * | 2/1987 | Yu et al. | ............... 51/295 |
| 4,783,368 | A | * | 11/1988 | Yamamoto et al. | ......... 428/408 |
| 4,914,551 | A | * | 4/1990 | Anschel et al. | ............. 361/714 |
| 5,783,316 | A | * | 7/1998 | Colella et al. | ............. 428/660 |
| 5,855,967 | A | * | 1/1999 | Kirkpatrick | ................. 427/527 |
| 6,447,852 | B1 | * | 9/2002 | Gordeev et al. | ............ 427/577 |
| 6,673,439 | B1 | * | 1/2004 | Miyamoto et al. | .......... 428/336 |
| 6,727,117 | B1 | * | 4/2004 | McCoy | ...................... 438/106 |
| 2004/0053039 | A1 | * | 3/2004 | Ekstrom et al. | ............ 428/325 |

* cited by examiner

*Primary Examiner*—Roy King
*Assistant Examiner*—Ngoclan T. Mai
(74) *Attorney, Agent, or Firm*—Hayes Soloway P.C.

(57) ABSTRACT

Discontinuous diamond particulate containing metal matrix composites of high thermal conductivity and methods for producing these composites are provided. The manufacturing method includes producing a thin reaction formed and diffusion bonded functionally graded interactive SiC surface layer on diamond particles. The interactive surface converted SiC coated diamond particles are then disposed into a mold and between the particles and permitted to rapidly solidify under pressure. The surface conversion interactive SiC coating on the diamond particles achieves minimal interface thermal resistance with the metal matrix which translates into good mechanical strength and stiffness of the composites and facilitates near theoretical thermal conductivity levels to be attained in the composite. Secondary working of the diamond metal composite can be performed for producing thin sheet product.

87 Claims, 2 Drawing Sheets

Figure 1. Schematic Of Apparatus For Performing The CVR Process To Coat Diamond Particles With SiC
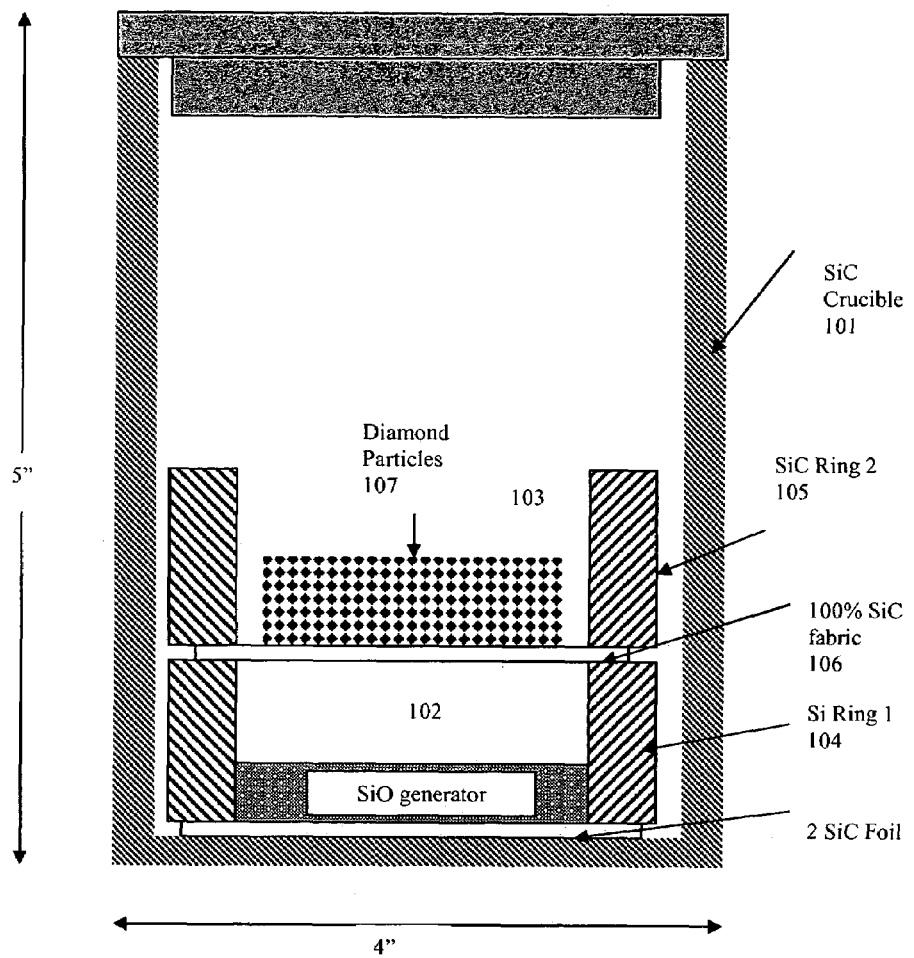

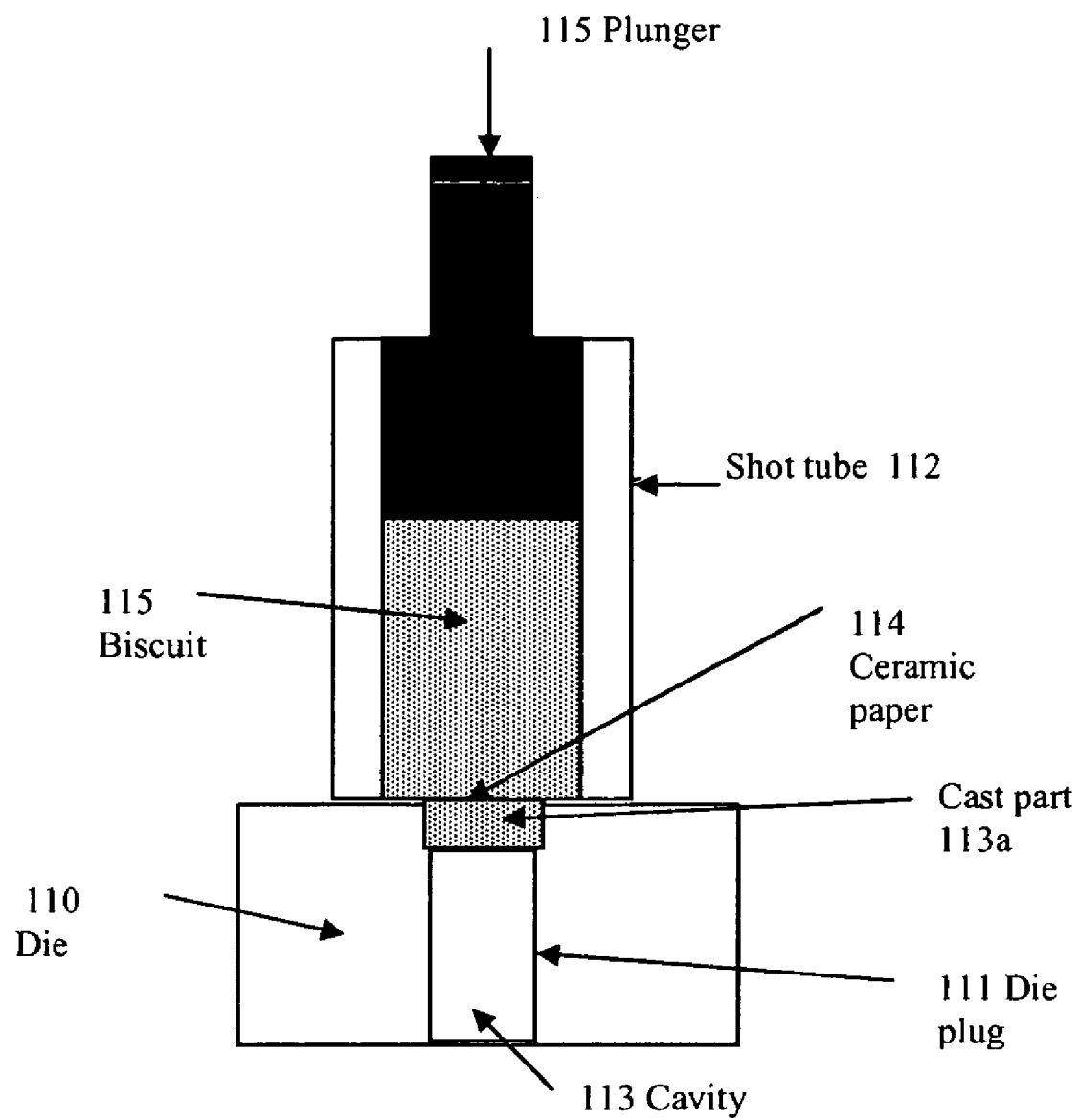
Figure 2 - Schematic of the squeeze casting assembly

HIGH THERMAL CONDUCTIVITY METAL MATRIX COMPOSITES

The invention relates, in general, to very high thermal conductivity metal matrix composite structures; and, more particularly, to such composite structures containing diamond particles which have a thin conversion surface layer of beta-SiC formed thereon by a chemical vapor reaction process. The SiC coating on these particles is present as a reaction zone, or graded layer, as opposed to a distinct SiC/coating build-up without a diffusion conversion interface, that would have been obtained by a coating process, such as chemical vapor deposition of SiC upon the diamond surface.

BACKGROUND OF THE INVENTION

There has been a considerable body of literature reported describing attempts to produce composite materials with very high thermal conductivity, e.g., for use in high power electronic packaging and other thermal management applications. Much of this literature relates to the addition of particulate fillers to a metal matrix, forming a metal matrix composite (MMC). The benefit of adding a particulate filler with a high thermal conductivity to a metal to form a metal matrix composite is well known. Properties of the MMC can often be optimized to suit the requirements of a particular application by properly selecting the properties of the particulate filler and metal matrix. Examples would include the addition of SiC particles to an Aluminum matrix. The SiC is readily wet by molten aluminum and aluminum alloys when it comes in contact with the filler particles. The Al/SiC composites have been reported to achieve strengths of 400 MPa at a filler loading of >40 vol. %, indicating a good bond was formed between the SiC particles and Al. MMC's comprised of particulate SiC and an aluminum matrix have advantages over pure Al structures in terms of coefficient of thermal expansion (CTE), stiffness, and wear resistance.

In general, however, the thermal conductivity of the Al/SiC MMC's do not meet desired expectations. Thermal conductivity of pure aluminum is ~200 W/m.k, and the thermal conductivity of pure crystalline SiC particles is ~320 W/m.k. Values of thermal conductivity for Al/SiC MMC's are generally <200 W/m.k, and typically <180 W/m.k (ref 1-5). These AlSiC MMC's were consolidated by processes such as stir casting, powder metallurgy, or low pressure and pressureless melt infiltration. These methods are relatively slow, and have a considerable residence time when the aluminum is in the molten state, allowing the SiC to react with the molten Al forming aluminum carbide. An example reaction is:

$$Al+3SiC=Al_4C_3+3Si \tag{1}$$

For that reason, these processes generally require the use of Al—Si alloys which decrease the activity of the Si and reduce the kinetics of the adverse carbide reaction during long contact times with the molten aluminum. These Al—Si alloys generally have a lower thermal conductivity than pure aluminum, thus reducing the thermal conductivity of the SiC/Al MMC. Alternatively, the use of rapid high pressure metal infiltration (also referred to as squeeze casting) to consolidate the particulate reinforced aluminum composites results in a much faster consolidation of the composite. Exposure times of the particles to the molten aluminum are generally seconds as opposed to hours for the non-pressure processes described above. As a result of the rapid consolidation with squeeze casting, pure aluminum can be used, and thermal conductivities of up to about 225 W/m.k would be expected for SiC loadings of ~55 vol. % in the composite.

Certain properties of diamond make it particularly attractive as a possible filler for high thermal conductivity MMC's. The thermal conductivity of diamond is about 700-2000 W/m.k, depending on crystalline perfection. It also has a low CTE (approximately 1 p.p.m./degree centigrade). However, researchers using consolidation processes for diamond/aluminum MMC's with a long exposure time for diamond contact with the molten aluminum have been unable to obtain high levels of thermal conductivity. Composites comprising an aluminum matrix containing 50 vol. % of industrial diamond particles have been reported to have a thermal conductivity <200 W/m.k (Johnson and Sonuparlac, ref 3). A microstructural examination of the diamonds in the composite revealed the presence of a thick surface layer of aluminum carbide ($Al_4C_3$) on the diamond particles. This surface layer is formed by the reaction shown in equation (2).

$$3C+4Al=Al_4C_3 \tag{2}$$

Aluminum carbide is generally recognized to have low thermal conductivity, and is hydroscopic. The diamond particles with the thick layer of aluminum carbide formed on the surface, in effect, function more as an aluminum carbide particle than a diamond particle, resulting in poor thermal conductivity for the composite.

Coating the diamond particles with a protective layer before contacting the diamond particles with molten aluminum forming the aluminum composite can prevent the reaction to form $Al_4C_3$. The application of a distinct SiC coating on diamond particles and subsequent composite formation with Al has been described in the literature (ref 6). A loose bed of industrial diamond powder (Beta Diamond Products), with a particle size of 40-50 microns, was coated with SiC using a chemical vapor deposition process of the diamond particle array, which was termed chemical vapor infiltration, or CVI, by the authors. In this CVI process, a distinct SiC coating is applied or deposited on the surface of the diamond particles. (It is known in the art that the deposition of SiC by the CVI process occurs at about 1000 degrees centigrade.) Johnson and Sonuparlac estimated the thickness of the SiC coating varied between 0.41 to 1.6 microns, depending on process conditions. They further estimated the total SiC content of the coated diamond particles at 3% to 11% by volume. The preform particle arrays were observed to have stiffened by the CVI SiC coating. The SiC coated diamond preforms were infiltrated by a pressureless metal infiltration process, using an Al-15Si-5Mg wt. % alloy. Process conditions were optimized to assure complete infiltration of the preform. The relevant properties of the MMC's are shown in Table I.

TABLE I

Physical properties of ~50 vol. % diamond/Al MMC composites described in reference 6.

| Coating Thickness (Microns) | $Al_4C_3$ content (wt %) | Density (gm/cc) | Thermal Conductivity (W/m-K) | CTE (ppm/K) | Young's modulus (Mpa) |
|---|---|---|---|---|---|
| 0.41 | 0.078 | 3.168 | 239 | 6.8 | 368 |
| 0.53 | 0.071 | 3.161 | 242 | 6.5 | 385 |
| 0.97 | 0.053 | 3.13 | 259 | 5.2 | 407 |
| 1.21 | 0.047 | 3.125 | 131 | 5.9 | 408 |
| 1.23 | 0.073 | 3.22 | 240 | 4.6 | 398 |

TABLE I-continued

Physical properties of ~50 vol. % diamond/Al MMC composites described in reference 6.

| Coating Thickness (Microns) | Al$_4$C$_3$ content (wt %) | Density (gm/cc) | Thermal Conductivity (W/m-K) | CTE (ppm/K) | Young's modulus (Mpa) |
|---|---|---|---|---|---|
| 1.42 | 0.12 | 3.213 | 225 | 5.0 | 413 |
| 1.6 | 0.093 | 3.16 | 234 | 4.5 | 427 |

At all levels of SiC coating thickness, it appears the formation of Al$_4$C$_3$ on the diamond particle has been reduced to a very low level, but remains greater than zero. The densities reported are consistent with the author's claim of full infiltration of the SiC coated diamond preforms with the aluminum alloys. The thermal conductivity values of the composite, ranging from 131-259 W/m.k, however, are very low considering the relatively high loading of diamond particles in the composite (40-50 vol. %), and the thermal conductivity of the diamond. There is no apparent relationship between SiC coating thickness on the diamond particles and the thermal conductivity of the composite. The authors of that work indicated they believe that the increased stiffness (Young's modulus) observed with increased SiC coating thickness on the diamond particles is due to the formation of SiC bridges between the diamond particles. These results seem to indicate that the SiC coating thickness may be excessive, thereby causing bridging between the diamond particles. However, with the CVI process, it is difficult to obtain a thin uniform SiC coating on the diamond particles, i.e. covering 100% of the diamond surface.

Unlike the above described prior art, the instant inventors have used rapid high pressure melt infiltration (squeeze casting) to prepare composites of aluminum with uncoated diamonds. As described above, this process reduces exposure time of the diamond to the molten aluminum to a very short time (e.g., <2 seconds). Thermal conductivity of the composite was still <200 W/m.k, even though there was expected to be minimal aluminum carbide at the surface of the diamond particles.

BRIEF SUMMARY AND OBJECTS OF THE INVENTION

Briefly stated, the present invention involves the provision of a composite structure comprised of a metal matrix having diamond particles dispersed therein, wherein the diamond particles are characterized by the presence of a layer of beta-SiC chemically bonded to the surface thereof and wherein the carbon of the SiC is derived from the diamond of the respective particle to which it is bonded.

Advantageously, the matrix of the composite structure is comprised essentially of a metal selected from among aluminum, copper, magnesium and alloy of one or more of said metals.

In a preferred embodiment of the invention the matrix is comprised of aluminum. In another embodiment, the matrix metal is comprised of copper.

The present invention is concerned with the preparation of diamond particulate with SiC chemically bonded thereto that is an essential component of such novel metal matrix composites.

The instant invention further describes the formation of a metal matrix composite containing such diamond particles coated with SiC applied by a different process that results in a very high thermal conductivity for the composite.

It is, therefore, a primary object of the present invention to provide a metal matrix composite with substantially improved thermal conductivity.

It is another valuable object of the present invention to provide a SiC coated diamond particulate with the necessary characteristics to enable its use in the formation of such high thermal conductivity MMC's.

It is another valuable object of the present invention to provide a novel process to produce the above-mentioned SiC coated diamond particulates.

It is another valuable object of the present invention to provide a process to incorporate the above-mentioned SiC coated diamond particulate in a metal matrix and obtain the aforementioned very high thermal conductivity metal matrix composite.

Advantageously, the above-mentioned high thermal, conductivity metal matrix compositions are produced by a method wherein the layer of chemically bonded SiC is produced in-situ on the diamond particles of an array thereof that is then embedded in the metal matrix, preferably by a rapid high pressure metal infiltration technique known as squeeze casting.

Preferably, the chemically bonded layer of SiC is produced on the respective diamond particles by a chemical vapor relation process (CVR) by contacting the diamond particles with SiO gas.

BRIEF DESCRIPTION OF THE DRAWINGS

FIG. 1 is a schematic of apparatus suitable to carry out the CVR process to coat diamond particles with SiC in accordance with the present invention.

FIG. 2 is a schematic of apparatus suitable to perform the squeeze casting assembly to form the diamond metal matrix composites in accordance with the present invention.

DETAILED DESCRIPTION OF PREFERRED EMBODIMENT

Referring now to FIG. 1, there is shown a schematic drawing of an apparatus suitable for preparing diamond particles for use as a component of a composite structure including a metal matrix in which the diamond particles are dispersed according to the present invention, wherein the prepared diamond particles have a conversion surface layer of beta-SiC formed thereon.

In FIG. 1 there is shown in side elevation a cross sectional view of a crucible 101 formed of SiC and which is divided into a lower chamber 102 and an upper chamber 103 by means of a lower ring 104 of Si and an upper ring 105 of SiC and having a web 106 of 100% SiC fabric disposed between the two rings. The 100% SiC fabric was formed by reacting graphite fabric with gaseous SiO, to produce essentially 100% conversion of the graphite to SiC.

The lower chamber 102 houses a SiO generator.

The SiO generator was prepared by mixing silicon (Si) and silica (SiO$_2$) in equimolar ratios. As the crucible 101 is heated above 1200 degrees centigrade, SiO gas is formed from the reaction in the generator as shown in equation 3:

$$Si + SiO_2 = 2SiO \text{ (g)} \qquad (3)$$

The SiO gas produced in the lower chamber 102 passes through the SiC fabric 106 to the upper chamber 103 and reacts with an array of diamond particles 107 that are deployed on top of the SiC fabric 106 that a sufficient quantity of SiO is generated to ensure the surface of the diamond particles is converted to SiC over the entire surface of each particle.

FIG. 2 shows a die assembly suitable for high pressure squeeze casting of metal matrix composites made in accordance with the present invention. This apparatus is fabricated from tool steel and consists of the die 110, die plug 111, and shot tube (or gate) 112. A cavity 113 is machined in the die corresponding to the required geometry for the squeeze cast part 113a. The die plug 111 has a 0.005" clearance to the die cavity 113 to allow air to be vented from the casting as it fills with molten aluminum. The inside diameter (ID) of the shot tube 112 is sufficiently large such that it completely covers the die cavity 113. To produce a composite casting with aluminum and a particulate powder,. the powder is placed in the die cavity 113, and shaken to provide a uniform loading of maximum density. Ceramic paper 114 is placed in the shot tube 112 to cover the powder filled die 110. A quantity of molten aluminum sufficient to fill the die cavity 113 plus part of the shot tube 112 is then poured in the shot tube 112. Pressure is then applied, up to 15,000 psi via the plunger 115 to achieve a rapid filling of the die cavity 113 and achieve approximately 100% density in the metal matrix composite. After cooling, the solidified part 113a and partially filled shot tube 112 containing the biscuit 115 are removed from the die assembly. The biscuit 115 is removed by metal removal techniques such as milling or sawing to produce the desired composite article or cast part 113a.

For certain kinds of solid state devices, the trend in electronic packaging is toward managing smaller devices with higher power levels. Management of very high power densities in many electronic chips has become a major challenge. Lack of proper thermal management can cause chip temperatures to increase during operation to the point where they overheat resulting in both performance and reliability reductions. The preferred route to prevent this heat buildup is to mount the chip on a high thermal conductivity substrate which will conduct the heat away from the chip to a large heatsink therefore limiting the maximum temperature of the chip during operation to an acceptable value. The chip is generally attached to the substrate by means of a high thermal conductivity solder or some polymeric adhesive. Solder is generally preferred over the adhesives because the solders generally have a higher thermal conductivity than the organic adhesive.

There is an additional mechanism by which the chip can be damaged, and that relates to the relative coefficient of thermal expansion of the chip and the substrate. When a chip is attached to a substrate with solder, the components must be heated to a temperature sufficiently high to melt the solder (180 degrees centigrade –425 degrees centigrade). When the package is subsequently cooled, the solder solidifies providing a bond between the chip and substrate. As the package is cooled further to room temperature, differential thermal expansion of the chip and substrate can lead to the buildup of substantial mechanical stresses in the chip. This cool down, plus continued thermal cycling of the package can cause fatigue in either the substrate, chip, or interface, affecting performance and lifetime. When these stresses exceed the tensile strength limits of the chip, they can cause cracking (delamination) to occur. The materials commonly used for electronic chips are either Si with a CTE ~3 p.p.m./degrees centigrade, or GaAs which has a CTE ~6 p.p.m./degrees centigrade. It would be very desirable to use a substrate with a CTE that is closely matched to that of the chip. It would be even more desirable to have a substrate with such thermal expansion characteristics combined with a very high thermal conductivity.

One type of substrate used in the electronic packages described above is a ceramic substrate. For relatively low chip power levels, an aluminum oxide substrate is commonly used, which has a thermal conductivity of ~20-40 W/m.k and a CTE of ~7 p.p.m./degrees centigrade. For higher power chips, an aluminum nitride ceramic substrate with a thermal conductivity of ~150-200 W/m.k and a CTE of ~4 p.p.m./degrees centigrade may be a better choice. Aluminum nitride ceramic substrates generally represent the highest thermal conductivity alternative in ceramic substrates other than the toxic BeO. These aluminum oxide and aluminum nitride ceramic substrates have excellent electrical insulating characteristics, which is desirable for many electronic packages, including those based on bipolar chips. However, for electronic packages based on LDMOS chips wherein the bottom side of the device becomes the source contact, a substrate is required which has good electrical conductivity between the front and back faces or surfaces. While this may be accomplished by fabricating electrically conductive vias in the ceramic substrate, which would electrically connect those two surfaces, it would be generally be simpler to have the substrate body itself be electrically conductive, in addition to having properties of high thermal conductivity and a good CTE match to the chip. For these LDMOS devices, MMC substrates can often meet the CTE and electrical conductivity requirements, but are limited in the thermal conductivity they can achieve. The Al/SiC particulate reinforced MMC described above has a thermal conductivity of ~180-225 W/m.k, CTE of ~7 p.p.m/degrees centigrade and good electrical conductivity. A much higher thermal conductivity would be desirable given the tendency for LDMOS chips to operate at very high power densities.

A metal matrix composite manufactured as described in the present invention with an aluminum matrix and containing particulate diamond prepared in accordance with the present invention can meet all the needs of those LDMOS electronic packages. Al has a thermal conductivity of ~200 W/m.k. Diamond has a thermal conductivity between about 700-2000 W/m.k. Furthermore, the relatively low CTE of diamond (~1 p.p.m./degrees centigrade) will result in a CTE for the composite which is a better match to either Si or GaAs chips than the unfilled metals. However, with the exception of the present invention, the particulate diamond reinforced MMC's described in the literature have demonstrated only a marginal improvement in thermal conductivity over the Al/SiC MMC's readily available. The MMC's described in the instant invention have unexpectedly high thermal conductivities, with values up to ~650 W/m.k demonstrated to date, and with the potential for even higher levels of thermal conductivity, e.g. values of 800 W/m.k and above.

Embodiment of FIG. 1

In order to make a metal matrix composite of Al with a diamond particulate filler such that a very high thermal conductivity for the MMC is obtained, a thin, uniform, surface conversion, adherent coating of SiC must be present on the diamond prior to composite formation. The purpose of this coating is to provide an interfacial coupling layer between the diamond and the aluminum, which in addition to being readily wet by the aluminum, provides graded acoustical impedance properties at the interface for enhanced phonon transfer. Furthermore, in accordance with the present invention, this SiC coating must be integrally bonded to the diamond in such a way that a distinct, discrete interface conversion layer between the diamond and the coating is produced to prevent any thermal barrier to heat transfer. Such a coating and process for providing that coating is described in this invention. The preferred embodiment for this invention is a thin SiC conversion coating which is formed by a reaction between the diamond particles and a gaseous silicon species such as SiO, as described in equation 4:

$$2C(\text{diamond}-s) + 2\, SiO(g) = SiC(s) + CO(g) \quad (4)$$

It is believed that the CVR conversion of the diamond surface initially results in a thin interface skin of SiC. (The inventors have observed formation of a thin interface surface skin of SiC in the reaction of SiO with graphite flake.) As the reaction time and/or temperature are increased, the coating development proceeds from the outer surface of the diamond particle toward the center, resulting in a reaction zone, or graded layer. The coatings obtained by a CVI or CVD process, on the other hand, are expected to have an abrupt interface between the SiC coating and the substrate. The CVI/CVD deposition temperature of SiC are below the temperature required to effect a conversion of the diamond surface to SiC and results in only a built-up coating free of any interface reaction with an abrupt interface between the diamond and CVI/CVD SiC coating. It is believed this CVI interface contributed to the poor thermal conductivity of the prior diamond/aluminum composite described by Johnson and Sonuparlac in ref 6.

Furthermore, this chemical vapor reaction (CVR) process ensures that a uniform surface layer of SiC is obtained at very low levels of conversion coating thickness. As described above, as the SiC coating thickness increases, the thermal conductivity of the SiC (~320 W/m.k) acts as a thermal barrier between the very high thermal conductivity diamond particles and the metal matrix, limiting the maximum thermal conductivity that can be achieved for the MMC.

In order to further understand the effectiveness of the thin SiC CVR conversion coating of the present invention, a prediction of composite thermal conductivity can be made using a rules of mixture calculation. While thermal conductivity is a transport property, and the rules of mixture calculation is not exact, it can provide insight into a comparison of the CVI coating on diamond described by Johnson and Sonuparlac in ref 6, with the CVR conversion coating of the present invention. The typical relation for simple mixtures would be:

$$(1 - f)^3 = \frac{K_{in}}{K_c}\left[\frac{K_c - K_p}{K_m - K_p}\right]^3 \quad (5)$$

Where f is the volume fraction of particle, and $K_m$, $K_p$, and $K_c$ are the thermal conductivities of the matrix, particle, and composite, respectively (ref 7). The above equation requires perfect heat transfer across the particle-matrix interface. This is limited by phonon scattering at the interface between dissimilar components. Calculations were carried out to estimate Kp in order to judge the effectiveness of the thermal interface. For an aluminum composite with 50 vol. % of diamond particles coated with the CVR process, a value of 200 W/m.k was used for Km, and 650 W/m.k for Kc (which was obtained for a composite produced using the CVR coating technology of this invention). This resulted in a calculated value for Kp of ~1938 W/m.k which is close to the maximum reported value for the thermal conductivity of diamond. This result indicates the CVR coating as taught by the present invention provides a nearly perfect thermal interface. Next the calculation was carried out for the composite described by Johnson and Sonuparlac in ref 6, which had a thick CVI coating of the present invention on the diamond particles. Using values of 45 vol. % for the diamond loading, 200 W/m.k for Km, and 250 for Kc, the calculated value for Kp was ~322 W/m.k. Thus the thin, graded CVR coating provides a much better thermal interface than the CVI coating.

The role of the SiC in acoustic coupling can be better understood by the following discussion. Treating phonons according to wave theory, and assuming transverse acoustic waves at normal incidence, the (intensity) reflection coefficient at a boundary between two different materials is given as:

$$R = \left[\frac{Z_1 - Z_2}{Z_1 + Z_2}\right]^2 \quad (6)$$

Where Z is the acoustic impedance, equal to the square root of the product of mass density and elastic modulus. Clearly, minimum reflection, and therefore maximum transmission, occurs when $Z_1 = Z_2$ Reflection, and therefore phonon scattering, increases as delta Z increases. In the case of thermal conductivity, the optimum acoustic impedance for a coating material would be:

$$Z_{coat} = \sqrt{Z_1 Z_2} \quad (7)$$

Table II gives the acoustic impedance of the relevant materials. Note that the acoustic impedance of SiC is close to the optimum matching impedance calculated from Equation 7 ($276 \times 10^5$ kg/m.s calculated vs. $310 \times 10^5$ kg/m.s for SiC) for an Al-diamond interface. This would predict the excellent performance of SiC conversion coated diamond in the aluminum matrix.

TABLE II

| Acoustic Impedance of Various Materials | | | |
|---|---|---|---|
| | Al | Diamond | SiC |
| Z($10^5$ kg/ms): | 136 | 561 | 310 |

A preferred process to coat the particulate diamond powder is illustrated in FIG. 1. The diamond particles are placed on a supporting SiC fabric, which is then placed in a crucible and heated to the reaction temperature. The crucible is placed in a furnace, in which a SiO partial pressure is generated by a reaction between $SiO_2$ and a reducing agent such as Si or C. After a predetermined time at temperature for the SiO-diamond conversion reaction to be completed, the furnace is cooled, and the fabric supporting the coated diamonds removed from the crucible. The SiC conversion coated diamond particles are removed from the fabric by peeling off the fabric from the coated diamonds. Any agglomerates are then broken up by mechanical agitation.

The reaction between the diamond and SiO to form SiC coated diamond will generally proceed more rapidly as the process temperature is increased. However at a certain temperature threshold, the diamond can be converted to graphite. In order to establish the limiting conditions in the apparatus in FIG. 1, the following experiments were conducted. Diamond particulate (Synthetic Diamond from Oshmens Corp.) was placed in a crucible and heated to 1550 degrees centigrade and 1600 degrees centigrade for up to 4 hours. X-ray diffraction (XRD) of the heat treated powders indicated the pattern for diamond, with no evidence of graphite. In a separate experiment, diamond powder, which had been reacted with SiO (Table III, Experiment 4), was heated to 1660 degrees centigrade for 3 hours. The XRD pattern gave no indication of any Conversion of diamond to graphite. However, when the same powder was heated to 1800 degrees centigrade for 8 hours, the XRD pattern on this sample showed a large graphite peak, a broadened diamond peak, and a SiC peak from the SiC conversion reaction. The significant conversion of diamond to graphite after 8 hours at 1800 degrees centrigrade led to a decision to restrict the diamond-SiG reactions to lower time and/or temperature.

A series of furnace runs were then carried out to react the diamond particulate with SiO. The SiO(g) generator for the conversion of diamond particles was made by adding equimolar ratios of silicon (Si) and silica (SiO$_2$). The silica used had a particle size of 150-300 microns. The mixture was milled for 1 hour using alumina milling media. The reaction of the Si and SiO$_2$ proceeds faster as the particle size of the Sio$_2$ is reduced. To minimize this effect, silica of the same particle size (150-300 microns) was used and the milling time was fixed at 1 hour.

Diamond powder of varying particle size, from 0.5 microns to 120 microns, was reacted at temperatures ranging from 1450 degrees centigrade to 1600 degrees centigrade for times of 1-8 hours. The coated diamond particles were then examined by XRD. The experiments are summarized in Table III. The XRD spectra of the diamonds showed a change that is attributed to the presence of a small concentration of SiC.

TABLE III

Experimental Runs to Prepare SiC Coated Diamonds via Reaction with SiO

| Expt. # | Diamond Particle Size (microns) | Maximum Temperature(C.) | Time at Max. Temp(hr) | Ratio of XRD Peak Height SiC/diamond |
|---|---|---|---|---|
| 1 | 15-30 | 1450 | 1 | 0.026 |
| 2 | 15-30 | 1550 | 3 | 0.073 |
| 3 | 120-150 | 1550 | 3 | 0.017 |
| 4 | 100-120 | 1550 | 3 | 0.014 |
| 5 | 30-40 | 1550 | 3 | 0.064 |
| 6 | 40-50 | 1550 | 3 | 0.014 |
| 7 | 100-120 | 1550 | 3 | 0.023 |
| 8 | 100-120 | 1550 | 3 | 0.015 |
| 9 | 100-120 | 1600 | 4 | 0.035 |
| 10 | 100-120 | 1600 | 4 | 0.034 |
| 11 | 100-120 | 1450 | 8 | 0.032 |
| 12 | 100-120 | 1550 | 3 | 0.041 |
| 13 | 100-120 | 1550 | 3 | 0.033 |
| 14 | 0.5-2.0 | 1550 | 3 | 0.595 |
| 15 | 0.5-2.0 | 1450 | 3 | 0.138 |
| 16 | 0.5-2.0 | 1450 | 1 | 0.111 |
| 17 | 0.5-2.0 | 1420 | 3 | 0.103 |

The last column of Table III shows the ratio of the peak height for beta-SiC at 2theta=35.7 to the peak height for diamond at 2theta=44.0. While the ratio of peak heights from XRD is not a quantitative procedure for compositional analysis, it allows a rough estimate of relative (but not absolute) SiC to diamond content in the reacted powders. The data in Table III indicates the variable with the largest impact on SiC formation is the particle size of the diamond.

The peak height ratio of SiC to diamond is generally 0.01-0.04 for 100-120 micron diamond particles, 0.03-0.07 for 15-30 micron diamond, and 0.1-0.6 for 0.5-2 micron diamond. Thus the largest diamond particles appear to have the lowest SiC content. For a given particle size diamond, increasing the temperature and time for the reaction generally results in a higher ratio of SiC peak height to diamond peak height. Given this information, and the supposition of this invention, it would be expected that the highest thermal conductivity for a composite would be obtained using the diamonds which have the lowest ratio of SiC XRD peak height to diamond XRD peak height. One such diamond powder would be from Experiment 4, Table III, with a particle size of 100-120 microns, and reacted for 3 hours at 1550 degrees centigrade with SiO. Conversely, the diamond powder with a particle size of 0.5-2.0 microns could be expected to produce composites with the lowest thermal conductivity.

Embodiment of FIG. 2.

FIG. 2 is a schematic of the squeeze casting assembly to form the diamond metal matrix composites. Diamond powder is placed directly into the die cavity of a tool steel die and shaken to achieve full tap density. The diamond powder bed is covered with a sheet of 1/32" alumina ceramic paper that acts as a filter to remove oxide particles from the melt during infiltration. To avoid entrapment of gases in the die casting, an 0.005" gap is maintained around the bottom plug in the die to allow trapped air to escape during infiltration. Aluminum is heated above the melt temperature (660 degrees centigrade) under Argon cover gas to avoid oxidation. The die is heated separately to a temperature slightly below the melting point of the Al. The heated die is removed from the heating furnace and transferred into the casting machine and Al melt is poured into the heated shot tube of the die. Infiltration is completed within a few seconds under pressurization. The die is cooled by unforced cooling in the casting machine prior to removal of the casting, which consists of the cast part and attached biscuit.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

EXAMPLES

Example 1

An aluminum metal matrix composite having diamond particles dispersed therein was formed by the following method. Loose uncoated diamond powder (Synthetic Diamond from Oshmens Corp.) of size 15-30 microns was placed directly into the die cavity of a tool steel die ( as illustrated in FIG. 2) and shaken to achieve full tap density of 50-55%. Dimensions of the die cavity were 2"×2"×0.25" The diamond powder bed was covered with a sheet of 1/32" thick high alumina ceramic paper which acts as a filter to remove oxide particles from the melt during infiltration. To avoid entrapment of gases in the die casting, a 0.005" gap was maintained around the bottom plug in the die to allow trapped air to escape during infiltration. Aluminum metal with a purity of 99.8% was heated to 850 degrees centigrade under Ar cover gas to avoid oxidation. The die was heated separately to a temperature of 650 degrees centigrade, slightly below the melting point of the Al (660 degrees centigrade). The heated die was removed from the heating furnace and transferred into the casting machine within 2 seconds and the Al melt was poured into the heated shot tube of the die maintained at 200 degrees centigrade. Infiltration was completed with 2 seconds, using a ram speed of 0.1 inch/sec. under pressurization and a maximum pressure of 15 ksi. The die was cooled to 300 degrees centigrade by unforced cooling in the casting machine prior to removal of the casting. Laser flash measurement of thermal conductivity on a number of samples produced by a number of casting runs returned values of conductivity in the range of 55-60 W/m.k. Measurement of strength of the composite using 4-point bend rupture yielded an average rupture strength of 22 ksi (average of 6 measurements).

Example 2

The procedure for forming an aluminum metal matrix composite with uncoated diamond powder described in example 1 was repeated using uncoated 100-120 micron diamond powder.

Laser flash measurement of thermal conductivity on a number of samples produced by a number of casting runs returned values of conductivity in the range of 150-200 W/m.k. Measurement of strength of the composite using 4-point bend rupture yielded an average rupture strength of 17 ksi (average of 6 measurements).

Example 3

The procedure for forming an aluminum metal matrix composite with uncoated diamond powder described in example 1 was repeated using uncoated 0.5-2 micron diamond powder.

Laser flash measurement of thermal conductivity on a number of samples produced by a number of casting runs gave an average value of conductivity of 105 W/m.k. Measurement of strength of the composite using 4-point bend rupture yielded an average rupture strength of 22 ksi Example 4

A process for producing an array of diamond particles having a conversion coating of SiC on the respective particles was performed as followed. Diamond particles (Synthetic Diamond from Oshmens Corp.) with a particle size of 15-30 microns were reacted with SiO by a chemical vapor reaction process as follows. Crucibles of the description shown in FIG. 1 were utilized. The crucibles were loaded with 30 grams of diamond particles, and the crucibles were placed in a high temperature furnace where SiO was caused to flow through the array of diamond particles in contact with the surface of each particle and the particles were heated in the furnace. The furnace was heated to 1550 degrees centigrade in a non oxidizing atmosphere using a flowing argon atmosphere, and held at that temperature for 3 hours. After the furnace was cooled to room temperature, the diamond particles with the conversion coating of SiC were removed from the SiC fabric.

Example 5

The coated diamond powder comprising an array of conversion coated diamond particles from example 4 (15-30 micron particle size) was placed directly into the die cavity of a tool steel die (as illustrated in FIG. 2) and shaken to achieve full tap density of 50-55%. Dimensions of the die cavity were 2"×2"×0.25" The diamond powder bed of SiC conversion coated particles was covered with a sheet of ⅟₃₂" thick high alumina ceramic paper which acts as a filter to remove oxide particles from the melt during infiltration. To avoid entrapment of gases in the die casting, a 0.005" gap was maintained around the bottom plug in the die to allow trapped air to escape during infiltration. Aluminum metal with a purity of 99.8% was heated to 850 degrees centigrade in a non-oxidizing atmosphere, under Ar cover gas to avoid oxidation. The die was heated separately to a temperature of 650 degrees centigrade, slightly below the melting point of the Al (660 degrees centigrade). The heated die was removed from the heating furnace and transferred into the casting machine within 2 seconds and the Al melt was poured into the heated shot tube of the die maintained at 200 degrees centigrade. Infiltration was completed within 2 seconds, using a ram speed of 0.1 inch/sec under pressurization and a maximum pressure of 15 ksi. The die was cooled to 300 degrees centigrade by unforced cooling in the casting machine prior to removal of the casting. Laser Flash measurement of thermal conductivity on a number of samples produced by a number of casting runs gave values of conductivity in the range of 234-250 W/m.k. Measurement of strength of the resulting composite using 4-point bend rupture yielded average rupture strength of 54 ksi (average of 6 measurements).

Example 6

Diamond particles of size 100-120 microns were reacted with SiO by repeating the chemical vapor reaction process described in example 4 to produce an array of SiC conversion coated diamond particles of larger particle size than those of Example 4.

Example 7

The die casting procedure for forming an aluminum metal matrix composite described in example 1 was repeated using the 100-120 micron chemical vapor reaction treated diamond powder array described in example 6. Laser flash measurement of thermal conductivity on a number of samples of the composite of SiC conversion coated diamond particles in the aluminum metal matrix produced by a number of casting runs gave values of conductivity in the range of 575-620 W/m.k. Measurement of strength of the composite using 4-point bend rupture yielded an average rupture strength of 51 ksi (average of 6 measurements).The coefficient of thermal expansion for the composite was measured at $7.1 \times 10^{-6}$ in/in/degrees centigrade.

Example 8

Diamond particles of size 0.5-2 microns were reacted with SiO by the chemical vapor reaction process described in example 4 to produce an array of conversion coated diamond particles of different size.

Example 9

The die casting procedure for forming an aluminum metal matrix composite described in example 1 was repeated using the array of 0.5-2 micron diamond particle chemical vapor reaction treated diamond powder described in example 8. Laser flash measurement of thermal conductivity on a number of samples of the composite of SiC conversion coated diamond particles in the aluminum matrix produced by a number of casting runs gave an average value of conductivity of 150 W/m.k. Measurement of strength of the composite using 4-point bend rupture yielded an average rupture strength of 51 ksi.

Example 10

One gram of phenolic resin was mixed with 1.2 grams of Si powder and ball milled overnight. Four grams of diamond powder with a particle size of 100-120 microns was added to the mixture, which was thoroughly mixed. The mixture was pressed at 5 ksi pressure in a 0.5" diameter die and heated to 160 degrees centigrade to provide green strength. The resulting small pellet was pyrolyzed at 1600 degrees centigrade for 1 hr to produce a rigid preform with strength of >15 ksi. The pellet was placed in a steel die and infiltrated with Al using the same conditions as described above in example 1. Laser Flash measurement of thermal conductivity on a number of samples of the composite of SiC conversion coated diamond particles in the aluminum matrix produced by a number of casting runs produced values of conductivity in the range of 300-320 W/m.k.

Example 11

The process of example 10 was repeated using a reduced amount of phenolic and Si: 0.5 gm. of phenolic resin and 0.6 gm. of Si powder. Diamond powder weight was the same as in example 10 at 4 gm. Laser Flash measurement of thermal conductivity on a number of samples of the composite of SiC conversion coated diamond particles in the aluminum matrix produced by a number of casting runs produced an average value of conductivity of 475 W/m.k.

Example 12

A composite structure comprising diamond particle dispersed in a magnesium metal matrix was formed using a process generally as described in example 1. Loose uncoated diamond powder with a particle size of 100-120 microns was placed directly into the die cavity of a tool steel die of dimensions 2"×2"×0.25" and shaken to achieve full tap density of 50-55% The diamond powder bed was then covered by a sheet of ⅟₃₂" thick high alumina ceramic paper which acts as a filter to remove oxide particles from the melt during infiltration. To avoid entrapment of gases in the die casting, a 0.005" gap was maintained around the bottom plug in the die to allow trapped air to escape during infiltration. The 99.8% purity Mg melt was heated to 830 degrees centigrade under Ar-2.5% SF6 cover gas to avoid oxidation. The die was heated separately to a temperature of 620 degrees centigrade, slightly below the melting point of the Mg (647 degrees centigrade ). The heated die containing the diamond powder was removed from the heating furnace and transferred into the casting machine within 2 seconds and pure Mg melt was poured into the heated shot tube of the die maintained at 200 degrees centigrade. Infiltration was completed within 2 seconds, using a ram speed of 0.1 inch/sec. under pressurization and a maximum pressure of 15 ksi. The die was cooled to 300 degrees centigrade by unforced cooling in the casting machine prior to removal of the casting. Laser flash measurement of thermal conductivity on a number of samples of the composite produced by a number of casting runs returned values of conductivity in the range of 120-250 W/m.k.

Example 13

The procedure for forming a magnesium metal matrix composite as described in example 12 was repeated using the 100-120 micron chemical vapor reaction treated diamond powder having an integral conversion coating of SiC as described in example 6. Laser flash measurement of thermal conductivity on a number of samples of the composite of SiC conversion coated diamond particles dispersed in the magnesium metal matrix produced by a number of casting runs returned values of conductivity in the range of 520-550 W/m.k. Measurement of strength of the composite using 4-point bend rupture yielded an average rupture strength of 28 ksi (average of 6 measurements).

Example 14

A quantity of diamond particles with a size of 100-200 microns were placed in a column with an argon gas purge which was pulsed in order to jolt and move the diamond particles. The column of diamond particles was heated to 1200 degrees centigrade and a SiC organometallic (many are suitable for depositing SiC such as, methyltrichloro silane, dimethyldichlorosilane, triethylsilane, etc.) gas was passed through the diamond particles such that a thin coating of SiC was deposited on the diamond particles. After deposition stopped, the quantity of SiC coated diamond particles was heated to 1600 degrees centigrade for 1 hour to cause diffusion of the SiC into the diamond surface and produce a conversion coating of SiC on the diamond particles, which were then suitable for inclusion as the dispersed diamond particles in a matrix of magnesium metal as in example 13.

Example 15

An analogous experiment to example 14 using a magnesium metal matrix was performed except silicon tetrachloride and hydrogen was utilized to deposit silicon on the diamond (particle size 100-120 microns) particle surface at 1100 degrees centigrade. After a thin, coating of silicon was formed, the Si coated diamond was heated to 1600 degrees centigrade for 1 hour, wherein the Si reacted with the diamond surface to form a conversion layer of SiC on the diamond particle surface.

Example 16

The SiC conversion coated diamond particles described in examples 14 and 15 were squeeze cast with aluminum as described in example 1 to produce a composite SiC coated diamond particles in an aluminum metal matrix. A laser flash measurement of thermal conductivity gave values in the range of 550-620 W/m.k.

Example 17

To make net shape parts, graphite tooling for a casting die was prepared from graphite stock which was premachined with a shaped cavity corresponding to the shape and thickness of the required net shape part and covered with a graphite lid. Tooling tolerances were maintained at +/−0.005" to plates and round parts. The completed graphite tooling and lid was then perforated with a series of 1/16" holes drilled through it to allow air to escape from the diamond filler during casting. The graphite tooling could also be patterned with a series of grooves to correspond to the fins on a heat sink design for instance or with a stud at a location corresponding to a through hole in a heat spreader diamond/Al part to allow an attachment point. To fill the die with diamond powder, the graphite tooling was wrapped in ceramic paper which was fixed in place by continuous graphite fiber in a hoop winding configuration to cover all the through drilled holes. The diamond powder was poured into the mold and tapped to full tap density corresponding to 45-55% of the volume of the mold. The graphite tooling was placed in a steel permanent pressure casting die and infiltrated with molten aluminum metal at a pressure of 3-10 ksi. To remove the graphite tooling after casting, the overlying Al metal was machined away and the graphite tooling surrounding the fully infiltrated composite piece was removed by grit blasting with 325 mesh glass beads. The remaining 1/16" metal feeders or gates corresponding to the holes drilled through the original tooling to facilitate Al flow were sheared away using a hand tool to leave a net shape composite diamond-aluminum casting. Thermal conductivity measurement on composite diamond-aluminum structures in the form of net shape parts cast in the graphite tooling using diamond powder as described in example 6, wherein the particle size of the diamond was 100-120 microns and the powder had a CVR SiC conversion coating, gave values in the range of 520-600 W/m.k. Four point bend strength of the castings was 46-51 ksi. In one heat spreader application, the gate tabs were left attached such that this geometry provided a high surface area to provide for exceptionally high heat transfer with the passing of air over the tabs.

Example 18

A diamond/Al composite plate of dimensions 2×2×0.1" was made by the method of graphite tooling described above in example 17 and was hot rolled at 550 degrees centigrade to a final thickness of 0.05", using multiple roll passes of 0.010" thickness reduction per pass with cross rolling after every other pass to maintain flatness of the part. Some minor edge cracking was observed after rolling which extended 0.1" into the part. These edges were removed by shearing. Thermal conductivity of the part was measured before and after rolling and remained unchanged at 520 W/m.k. Strength of the piece was 51 ksi measured in 4-point bending.

Example 19

A diamond/Al composite plate of 0.05" thickness was produced by the rolling operation described above in example 18. This composite plate was hot stamped in a closed die at 500 degrees centigrade to form a 0.125×0.25×0.03" thickness piece with a raised rim of 0.05" height surrounding it. Thermal conductivity of the piece was maintained at 520 W/m.k after stamping.

Example 20

A diamond/Al composite plate of size 1×1×0.2" was produced by squeeze casting as described above in example 7. This composite plate was then open die hot forged at 500 degrees centigrade with applied pressure of 15 ksi at a strain rate of 0.0001/sec. After forging, the thickness of the composite plate was reduced from 0.25 to 0.05" which corresponded to a forging strain of 150%. Measurement of thermal conductivity of the composite plate after forging showed that the thermal conductivity of the material remained unchanged from the starting value of 585 W/m.k before forging.

Example 21

100-120 mesh size (100 micron) coated diamond powder, as described in example 6, was fully mixed with 99.8% purity Al powder of 45 micron size by tumbling in a ceramic ball mill. The weight ratio of the two powders was chosen to correspond to a 40% by volume diamond/Al composite. The powder mixture was transferred into a 1" diameter casting graphite die and hot pressed at a temperature close to the Al melting point for 1 hr at 640 degrees centigrade at a pressure of 6 ksi. The resulting composite diamond and aluminum billet was sectioned for strength and thermal conductivity measurement. Thermal conductivity measurements were in the range of 400-430 W/m.k and four point strength measurements were 46-52 ksi.

Example 22

A composite structure comprised of a metal matrix composed of copper having SiC conversion coated diamond particles dispersed therein was formed by the following methods. Loose SiC conversion coated diamond powder of 100-120 micron size prepared as in example 6 was well mixed with 99.9% purity Cu powder to produce a Vf=35-40% diamond loading. The powder was tumbled for 2 hrs to complete mixing and 'canned' in an evacuated Mo tube and hipped at a pressure of 15 ksi, for 2 hrs at a temperature of 1025 degrees centigrade. The consolidated billet was removed from the 'canning' and warm forged to a thickness reduction of 75%. The composite material was sectioned for thermal conductivity measurement and showed a value of 550 W/m.k.

Example 23

A similar composite structure to that described in example 22 comprised of a copper metal matrix with diamond particles dispersed therein was formed as follows: Loose SiC conversion coated diamond powder of 100-120 microns size was copper metallized using known art of chemical reduction and electrolyte. The coating thickness was sufficient to provide a Vf=35-40% diamond particle loading on full powder consolidation. The coated powder was consolidated using field activated sintering techniques (FAST) known in the art as plasma activated sintering (PAS) which consists of applying a pressure to the powder (copper coated diamond with the SiC surface conversion) during a pulsed discharge of energy. The thermal conductivity was determined to be 566 W/m.k.

REFERENCE

1) "Packaged for the Road" Mechanical Engineering, July 2001.
2) Lanxide Corporation published data sheets of composites fabricated by LANXIDE TM, PRIMEX TM and PRIMEX CAST TM, USA, 1997.

3) Duralcan Corp. published data sheets of composites fabricated by stir casting, USA, 1994.
4) A. L. Geiger, D. P. H. Hasselman, and P. Welch, Acta Mater., Vol 45, No. 9, pp 3911-3914, (1997).
5) "A new substrate for Electronic packaging: AlSiC Composites", M. Occhinero, R. Adams, and K. Fennessey, Proceedings of the 4$^{th}$ Annual Portable by Design Conference, Electronics Design, March 24-27, pp 398-403.
6) "Diamond/Al metal matrix composites formed by the pressureless metal infiltration process", W. Johnson and B Sonuparalak, J. Materials Research, V8, No. 5, pp. 1169-1173, 1993.
7) "The effect of particle size on the thermal conductivity of ZnS/diamond composites", A. Every, Y. Tzou, D. Hasselman, R. Raj, Acta Mater., V40, No.1, pp. 123-129, 1992.

What is claimed is as follows:

1. A composite structure comprised of a metal matrix having diamond particles dispersed therein, wherein said diamond particles are characterized by the presence of a layer of beta-SiC chemically bonded to the surface thereof, said composite structure having a thermal conductivity greater than about 300 W/m.k., and wherein the metal matrix material is essentially either aluminum or magnesium.

2. The structure of claim 1 wherein the metal matrix material is essentially aluminum.

3. The structure of claim 1 wherein the metal matrix material is essentially magnesium.

4. The structure of claim 1 wherein the carbon of the SiC is derived from the respective diamond particles to which it is bonded.

5. The structure of claim 1 wherein the diamond particles are in the size range of 100-120 microns.

6. An electronic package for high power applications, requiring very high thermal dissipation, comprising a composite structure as defined in claim 1 having a high thermal conductivity further characterized by the presence of a layer of aluminum nitride deposited on the surface thereof, said aluminum nitride providing an electrically insulating layer and also providing a high thermal conductivity path allowing for electronic chips to be bonded to the electrically insulating aluminum nitride layer, and also allowing electronic circuitry to be formed or deposited on the aluminum nitride.

7. The structure of claim 1, having a thermal conductivity greater than about 400 W/m.k.

8. The structure of claim 1, having a thermal conductivity greater than about 500 W/m.k.

9. The structure of claim 1, having a thermal conductivity greater than about 600 W/m.k.

10. A metal matrix composite comprising a matrix containing diamond powder, said diamond powder having a thin SiC surface layer on the respective diamond particles comprising said powder, said SiC layers being comprised of a conversion coating formed by a chemical vapor reaction of SiO with the respective diamond particles, and said metal matrix composite having a thermal conductivity greater than about 300 W/m.k., and wherein the metal employed is essentially either aluminum or magnesium.

11. The composite described in claim 10, having a thermal conductivity greater than about 400 W/m.k.

12. The composite described in claim 10, having a thermal conductivity greater than about 500 W/m.k.

13. The composite described in claim 10, having a thermal conductivity greater than about 600 W/m.k.

14. The composite of claim 10, wherein the metal employed is aluminum.

15. The composite of claim 11, wherein the metal employed is aluminum.

16. The composite of claim 12, wherein the metal employed is aluminum.

17. The composite of claim 13, wherein the metal employed is aluminum.

18. The composite of claim 10, wherein the metal employed is magnesium.

19. The composite of claim 11, wherein the metal employed is magnesium.

20. The composite of claim 12, wherein the metal employed is magnesium.

21. The composite of claim 13, wherein the metal employed is magnesium.

22. The composite described in claim 10, wherein the content of the SiC coated diamond powder in the composite is about 10-60 vol % of the total.

23. The composite described in claim 10, wherein the content of the SIC coated diamond powder in the composite is greater than about 70 vol % of the total.

24. The composite described in claim 10, wherein the content of the SiC coated diamond powder in the composite is greater than 80 vol % of the total.

25. The composite described in claim 10, wherein the particle size of the diamond powder used is preferably about 50-150 microns.

26. The composite described in claim 10, wherein the particle size of the diamond powder used is preferably greater than 150 microns.

27. The composite described in claim 10, wherein the particle size of the diamond powder is greater than about 200 microns.

28. The composite described in claim 10, wherein the particle size of the diamond powder is greater than about 300 microns.

29. A metal matrix composite containing diamond powder, said diamond powder comprising diamond particles having a thin SiC surface conversion coating formed thereon, such coating being formed by heating a preform of Si powder and diamond powder plus a binder, the purpose of said binder being to hold the Si in contact with the surface of the respective diamond particles, heating said preform to a temperature sufficient to cause the surface conversion reaction to occur, and said metal matrix composite having a thermal conductivity greater than about 300 W/m.k., and wherein the metal comprising the matrix is essentially either aluminum or magnesium.

30. The composite described in claim 29, having a thermal conductivity greater than about 400 W/m.k.

31. The composite described in claim 29, having a thermal conductivity greater than about 500 W/m.k.

32. The composite described in claim 29, having a thermal conductivity greater than about 600 W/m.k.

33. The composite described in claim 29, wherein metal comprising the matrix is aluminum.

34. The composite described in claim 30, wherein the metal comprising the matrix is aluminum.

35. The composite described in claim 31, wherein the metal comprising the matrix is aluminum.

36. The composite described in claim 32, wherein the metal comprising the matrix is aluminum.

37. The composite described in claim 29, wherein the metal comprising the matrix is magnesium.

38. The composite described in claim 30, wherein the metal comprising the matrix is magnesium.

39. The composite described in claim 31, wherein the metal comprising the matrix is magnesium.

40. The composite described in claim 29, wherein the content of the SiC coated diamond powder in the composite is about 10-60 vol % of the total.

41. The composite described in claim 29, wherein the content of the SiC coated diamond powder in the composite is greater than about 70 vol % of the total.

42. The composite described in claim 29, wherein the content of the SiC coated diamond powder in the composite is about greater than about 80 vol % of the total.

43. The composite described in claim 29, wherein the particle size of the diamond powder used is preferably about 50-150 microns.

44. The composite described in claim 29, wherein the particle size of the diamond powder used is greater than about 150 microns.

45. The composite described in claim 29, wherein the particle size of the diamond powder used is greater than about 200 microns.

46. The composite described in claim 29, wherein the particle size of the diamond powder used is greater than about 300 microns.

47. The composite described in claim 29, wherein the temperature to which the preform is heated is at least 1300 degrees centigrade.

48. The composite described in claim 29, wherein the temperature to which the preform is heated is at least 1400 degrees centigrade.

49. The composite described in claim 29, wherein the temperature to which the preform is heated is at least 1500 degrees centigrade.

50. The composite described in claim 29, wherein the temperature to which the preform is heated is at least 1600 degrees centigrade.

51. The composite described in claim 29, wherein the temperature to which the preform is heated is at least 1700 degrees centigrade.

52. A high thermal conductivity substrate for LDMOS electronic packages, wherein the substrate is a metal matrix composite comprising a metal containing dispersed therein diamond particulates which have a thin SiC coating, said coating having been produced by a chemical vapor reaction process between gaseous SiO and the respective diamond particles, said metal matrix composite having a thermal conductivity greater than about 300W/m.k., and wherein the metal employed for the metal matrix is essentially either aluminum or magnesium.

53. The substrate of claim 52, wherein the metal employed for the metal matrix is aluminum.

54. The substrate of claim 52, wherein the metal employed for the metal matrix is magnesium.

55. The substrate of claim 52, wherein the process utilized to consolidate the metal matrix composite is pressure squeeze casting.

56. The substrate of claim 55, wherein the metal employed for the metal matrix is aluminum.

57. The substrate of claim 55, wherein the metal employed for the metal matrix is magnesium.

58. The substrate of claim 52, wherein said metal matrix composite has a thermal conductivity greater than about 400 W/m.k.

59. The substrate of claim 52, wherein said metal matrix composite has a thermal conductivity greater than about 500 W/m.k.

60. The substrate of claim 52, wherein said metal matrix composite has a thermal conductivity greater than about 600 W/m.k.

61. An electronic package containing an LDMOS chip bonded to a substrate with very high thermal conductivity, wherein said substrate is a metal matrix composite containing particulate diamond, and said particulate diamond has a thin SiC surface coating formed on the respective particles thereof by a chemical vapor reaction process between gaseous SiO and said diamond powder, said metal matrix composite having a thermal conductivity greater than about 300 W/m.k., and wherein the metal employed for the metal matrix is essentially either aluminum or magnesium.

62. The electronic package described in claim 61, wherein the metal employed for the metal matrix is aluminum.

63. The electronic package described in claim 61, wherein the metal employed for the metal matrix is magnesium.

64. The electronic package described in claim 61, wherein the process utilized to consolidate the metal matrix composite is pressure squeeze casting.

65. The electronic package described in claim 62, wherein the process utilized to consolidate the metal matrix composite is pressure squeeze casting.

66. The electronic package described in claim 63, wherein the process utilized to consolidate the metal matrix composite is pressure squeeze casting.

67. The electronic package described in claim 61, wherein said metal matrix composite has a thermal conductivity greater than about 400 W/m.k.

68. The electronic package described in claim 61, wherein said metal matrix composite has a thermal conductivity greater than about 500 W/m.k.

69. The electronic package described in claim 61, wherein said metal matrix composite has a thermal conductivity greater than about 600 W/m.k.

70. A high thermal conductivity substrate for LDMOS electronic packages, wherein the substrate is a metal matrix composite containing diamond particulates which have a thin SiC conversion coating, such coating being formed by heating a preform of Si powder and diamond powder plus a binder, the purpose of said binder being to hold the Si in contact with the diamond surface, and heating said preform to a temperature sufficient to cause the surface conversion reaction to occur, said metal matrix composite having a thermal conductivity greater than about 300 W/m.k., and wherein the metal employed for the metal matrix is essentially either aluminum or magnesium.

71. The substrate of claim 70, wherein the metal employed for the metal matrix is aluminum.

72. The substrate of claim 70, wherein the metal employed for the metal matrix is magnesium.

73. The substrate of claim 70, wherein the process utilized to consolidate the metal matrix composite is pressure squeeze casting.

74. The substrate of claim 73, wherein the metal employed for the metal matrix is aluminum.

75. The substrate of claim 73, wherein the metal employed for the metal matrix is magnesium.

76. The substrate of claim 70, wherein said metal matrix composite has a thermal conductivity greater than about 400W/m.k.

77. The substrate of claim 70, wherein said metal matrix composite has a thermal conductivity greater than about 500 W/m.k.

78. The substrate of claim 70, wherein said metal matrix composite has a thermal conductivity greater than about 600 W/m.k.

79. An electronic package containing an LDMOS chip bonded to a substrate with very high thermal conductivity, wherein said substrate is a metal matrix composite containing diamond particulates which have a thin SiC conversion coating, said coating being formed by heating a preform of Si powder and diamond powder plus a binder, the purpose of said binder being to hold the Si in contact with the diamond surface, and heating said preform to a temperature sufficient to cause the surface conversion reaction to occur, said metal matrix composite having a thermal conductivity greater than about 300 W/m.k., and wherein the metal employed for the metal matrix is essentially either aluminum or magnesium.

80. The electronic package described in claim 79, wherein the metal employed for the metal matrix is aluminum.

81. The electronic package described in claim 79, wherein the metal employed for the metal matrix is magnesium.

82. The electronic package described in claim 79, wherein the process utilized to consolidate the metal matrix composite is pressure squeeze casting.

83. The electronic package described in claim 80, wherein the process utilized to consolidate the metal matrix composite is pressure squeeze casting.

84. The electronic package described in claim 81, wherein the process utilized to consolidate the metal matrix composite is pressure squeeze casting.

85. The electronic package described in claim 79, wherein said metal matrix composite has a thermal conductivity greater than about 400 W/m.k.

86. The electronic package described in claim 79, wherein said metal matrix composite has a thermal conductivity greater than about 500 W/m.k.

87. The electronic package described in claim 79, wherein said metal matrix composite has a thermal conductivity greater than about 600 W/m.k.

* * * * *

UNITED STATES PATENT AND TRADEMARK OFFICE
CERTIFICATE OF CORRECTION

PATENT NO.       : 7,279,023 B2
APPLICATION NO.  : 10/677454
DATED            : October 9, 2007
INVENTOR(S)      : Pickard et al.

Page 1 of 1

It is certified that error appears in the above-identified patent and that said Letters Patent is hereby corrected as shown below:

Claim 23, Col. 18, line 19, "the SIC coated" should be --the SiC coated--.

Signed and Sealed this

Tenth Day of February, 2009

JOHN DOLL
*Acting Director of the United States Patent and Trademark Office*